(12) United States Patent
Tsai et al.

(10) Patent No.: US 7,397,106 B2
(45) Date of Patent: Jul. 8, 2008

(54) LASER FUSE WITH EFFICIENT HEAT DISSIPATION

(75) Inventors: Hao-Yi Tsai, Hsin-Chu (TW); Chao-Hsiang Yang, Hsin Chu (TW); Shang-Yun Hou, Jubei (TW); Chia-Lun Tsai, Hsin-Chu (TW); Shin-Puu Jeng, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 11/299,999

(22) Filed: Dec. 12, 2005

(65) Prior Publication Data

US 2007/0132059 A1 Jun. 14, 2007

(51) Int. Cl.
*H01L 23/62* (2006.01)

(52) U.S. Cl. ............... 257/529; 257/E23.15; 438/132; 438/601

(58) Field of Classification Search ............. 257/529, 257/E23.149, E23.15; 438/132, 601
See application file for complete search history.

(56) References Cited

U.S. PATENT DOCUMENTS

| | | | | |
|---|---|---|---|---|
| 5,990,537 A | * | 11/1999 | Endo et al. .................. 257/529 |
| 6,100,118 A | * | 8/2000 | Shih et al. .................... 438/132 |
| 6,162,686 A | * | 12/2000 | Huang et al. ................. 438/281 |
| 6,300,232 B1 | * | 10/2001 | Satoh .......................... 438/601 |
| 6,444,544 B1 | * | 9/2002 | Hu et al. ...................... 438/467 |
| 6,521,971 B2 | | 2/2003 | Tsai |
| 6,835,642 B2 | | 12/2004 | Yang et al. |
| 6,867,441 B1 | | 3/2005 | Yang et al. |
| 6,879,020 B2 | * | 4/2005 | Yamaguchi .................. 257/529 |
| 2001/0054745 A1 | * | 12/2001 | Tsai ........................... 257/529 |
| 2004/0140501 A1 | * | 7/2004 | Kim ........................... 257/328 |
| 2005/0161766 A1 | * | 7/2005 | Sato et al. ................... 257/529 |
| 2005/0239273 A1 | * | 10/2005 | Yang .......................... 438/601 |
| 2006/0118904 A1 | * | 6/2006 | Liaw ........................... 257/529 |
| 2007/0018279 A1 | * | 1/2007 | Lin et al. ...................... 257/529 |

\* cited by examiner

*Primary Examiner*—Bradley W. Baumeister
*Assistant Examiner*—Steven J Fulk
(74) *Attorney, Agent, or Firm*—Slater & Matsil, L.L.P.

(57) ABSTRACT

A semiconductor structure having an efficient thermal path and a method for forming the same are provided. The semiconductor structure includes a protection ring over a semiconductor substrate and substantially encloses a laser fuse structure. The laser fuse structure includes a laser fuse and a connection structure connecting the fuse to integrated circuits. The protection ring is thermally coupled to the semiconductor substrate by contacts. The semiconductor structure further includes a metal plate conducting heat generated by a laser beam to the protection ring.

14 Claims, 9 Drawing Sheets

LASER FUSE WITH EFFICIENT HEAT DISSIPATION

TECHNICAL FIELD

This invention relates generally to laser fuses in integrated circuits, and more particularly to structures and methods for protecting integrated circuits from damage caused by laser fuse burning.

BACKGROUND

A typical integrated circuit may include millions of devices or sub circuits. Some of the integrated circuits contain a lot of identical sub circuits. For example, a memory chip contains a lot of identical memory cells. Even if only one memory cell has defects, the entire chip may be rendered defective.

To increase yield, redundant memory cells are manufactured on the same chip. If some of the primary memory cells have defects, redundant memory cells can be used to replace the defective primary memory cells. This redundant configuration permits the semiconductor memory device to continue to operate in a normal state. The primary memory cells and redundant memory cells are all connected via fuses controlled by control circuits on the chip. As stated above, if a defective memory cell is discovered, a fuse coupled to the defective memory cells is blown and the redundant memory cell is connected instead. Accordingly, the semiconductor chip with defective primary memory cells can operate normally.

Highly integrated semiconductor memory devices have a fairly high manufacturing cost, which causes a big loss if any defective cells are discovered. This is why the memory devices include redundant memory cells for replacing defective primary memory cells. Types of fuses deployed in such semiconductor memory devices include electrical fuses selectively cut by the flow of excessive current, and laser fuses selectively cut by an applied laser beam. In contemporary systems, laser fuses are widely used due to their simplicity in use and layout. Electrical fuses are commonly used in semiconductor memory devices such as Electrically Erasable Programmable Read Only Memory (EEPROM) while the laser fuses are very often used in Dynamic Random Access Memory (DRAM).

Figure 1:
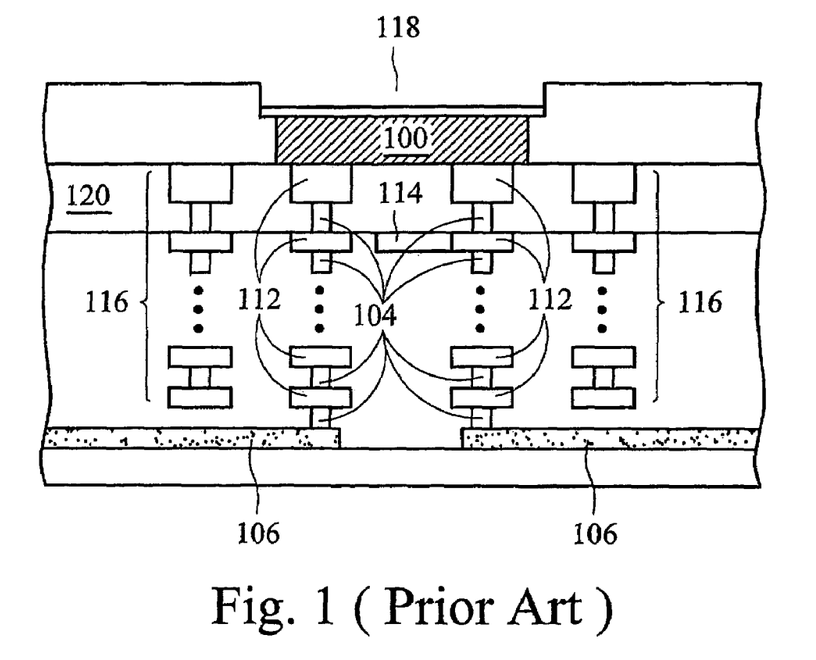
FIG. 1 illustrates a conventional protection ring enclosing a laser fuse.

FIG. 1 illustrates a conventional laser fuse structure. A laser fuse 100 is formed close to the top surface of the chip. Through layers of metal islands 112 and vias 104, the laser fuse 100 is connected to two conductive lines 106, which are in turn connected to integrated circuits. By etching and opening a fuse window 118, the laser fuse 100 is exposed and can be broken by a laser, and an open circuit is formed between the conductive lines 106. A redundant circuit will then replace a malfunctioned circuit.

Due to the high stress introduced during the laser process, a protection ring 116, which substantially surrounds the laser fuse 100, is typically formed to protect integrated circuits on the same chip from mechanical stress and/or to terminate any micro crack generated. The protection ring 116 is formed of interconnected metal lines and vias, and extends from the top metallization layer down to metallization layer one. A top view (not shown) will illustrate that the protection ring 116 forms a closed loop surrounding the laser fuse 100.

Mechanical stress and heat generated by laser processes damage the underlying structures and materials, such as low-k dielectric layers that are widely used as inter-metal dielectrics. A copper plate 114 is then used to buffer the mechanical stress. Typically, copper plate 114 connects to one of the metal islands 112. The top dielectric layer 120 is often formed of undoped silicate glass (USG) in order to improve the mechanical property and prevent moisture penetration. Since the dielectric material in which the fuse lines are formed has low thermal conductivity, no good heat path exists. A portion of heat dissipates to underlying metallization layers, which are formed of stacked layers of metal and low-k dielectrics. As a result, high thermal gradient and different thermal expansions occur, causing delaminating between layers.

Therefore, there is the need for a method preventing heat generated by laser processes from peeling the underlying layers.

SUMMARY OF THE INVENTION

The preferred embodiment of the present invention provides a semiconductor structure having an efficient thermal path and a method for forming the same.

In accordance with one aspect of the present invention, the semiconductor structure includes a fuse structure comprising a fuse and a connection structure over a semiconductor substrate, a protection ring over the semiconductor substrate and substantially enclosing the fuse structure, and at least one contact thermally coupling the protection ring and the semiconductor substrate. Preferably, a plurality of contacts directly connects the protection ring and the substrate. More preferably, the contacts extend into the semiconductor substrate for better thermal contact.

In accordance with another aspect of the present invention, the semiconductor structure further includes a thermally conductive plate underlying but not electrically coupled to the fuse, wherein the thermally conductive plate is thermally coupled to the protection ring. The thermally conductive plate is preferably formed of metals or metal alloys and is preferably formed in a metallization layer immediately underlying a top metallization layer.

In accordance with yet another aspect of the present invention, the protection ring includes a first region and a second region. The first region is connected to the substrate by contacts, and the second region is not connected to the substrate by contacts.

In accordance with yet another aspect of the present invention, a method for forming the preferred embodiments of the present invention includes forming an inter-layer dielectric (ILD) layer, forming a plurality of contacts in the ILD layer, and forming a protection ring connecting to the contacts. The step of forming the protection ring further includes the steps of forming a plurality of metal lines in respective metal layers and surrounding a fuse region of the semiconductor chip, forming a plurality of vias connecting the respective metal lines, and forming a plurality of dielectric layers respectively isolating each metal layer from any superjacent or subjacent metal layer.

In accordance with yet another aspect of the present invention, the method further includes simultaneously forming metal islands when the metal lines are formed, wherein the metal lines form a loop enclosing the metal islands, simultaneously forming additional vias connecting the metal islands when the vias of the protection ring are formed, forming a thermally conductive plate connecting the metal lines of the protection ring, and forming a fuse substantially over the metal plate and connecting the metal islands.

The advantageous features of the preferred embodiments of the present invention include reducing peeling and cracking during laser burning, and full compatibility with the existing integrated circuit fabrication processes.

BRIEF DESCRIPTION OF THE DRAWINGS

For a more complete understanding of the present invention, and the advantages thereof, reference is now made to the following descriptions taken in conjunction with the accompanying drawings, in which:

FIGS. 3A through 9B are cross-sectional views of intermediate stages in the manufacture of the preferred embodiments of the present invention.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 2:
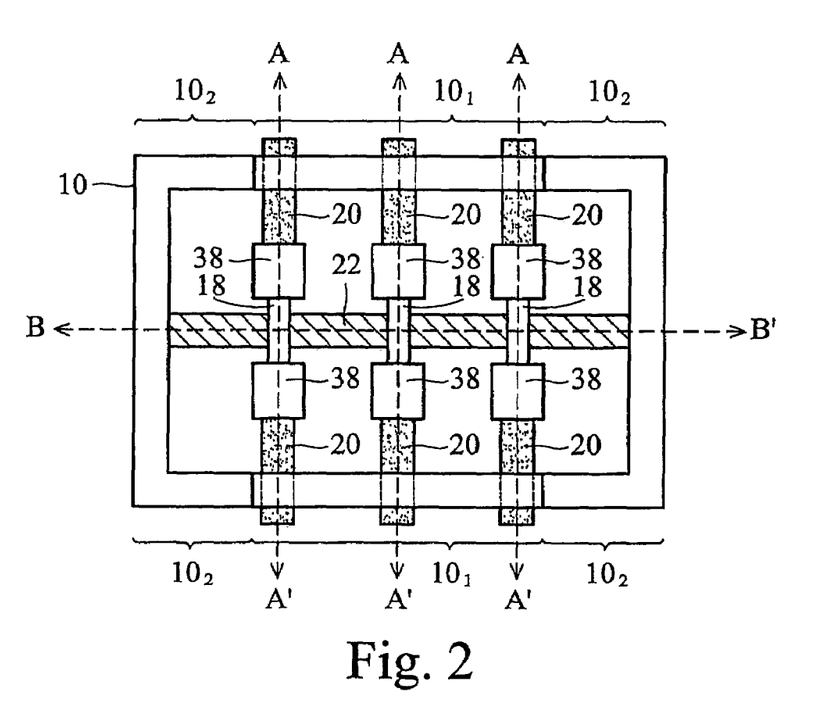
FIG. 2 illustrates a top view of the preferred embodiment of the present invention.

FIG. 2 illustrates a top view of the preferred embodiment of the present invention. For illustration purposes, features in different layers are shown in one plane. One skilled in the art will realize that these features may range from a top metallization layer to a substrate. A protection ring 10, which comprises portions $10_1$ and $10_2$, encloses one or more laser fuses 18, which are located over the top metallization layer (referred to as $M_n$) (not shown). Fuses 18 are connected to electrical circuits through conductive lines 20, which are preferably formed of polysilicon and located between a substrate and metallization layer one (referred to as $M_1$). Conductive lines 20 are connected to fuses 18 through layers of metal islands and vias. A metal plate 22 having high thermal conductivity is formed in a metallization layer underlying the top metallization layer, and is connected to the protection ring 10.

FIGS. 3A through 9B illustrate cross-sectional views in the manufacture of the preferred embodiment of the present invention. Each figure number may be followed by a letter A or B, wherein "A" indicates that the figure is a cross-sectional view along planes A-A', and "B" indicates that the figure is a cross-sectional view along a plane B-B' of FIG. 2. Throughout the various views and illustrative embodiments of the present invention, like reference numbers are used to designate like elements.

Figure 3A:
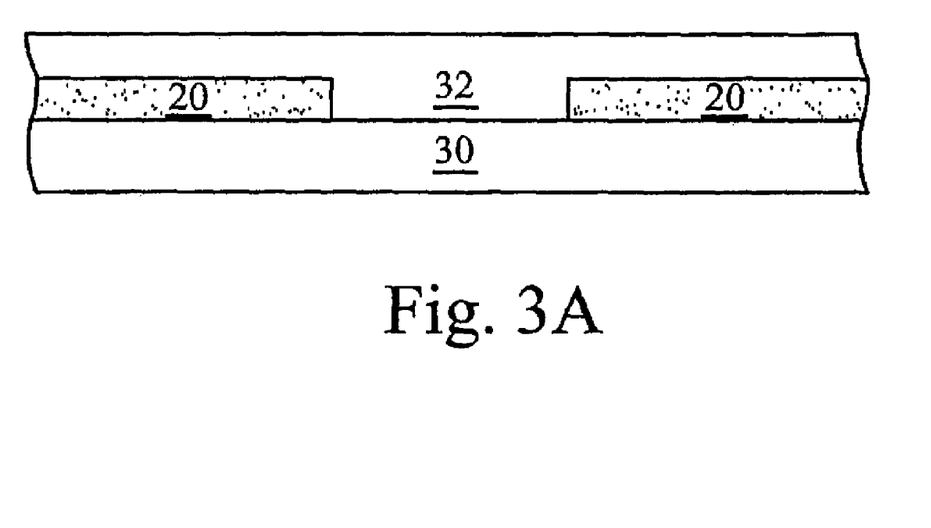
Figure 3B:
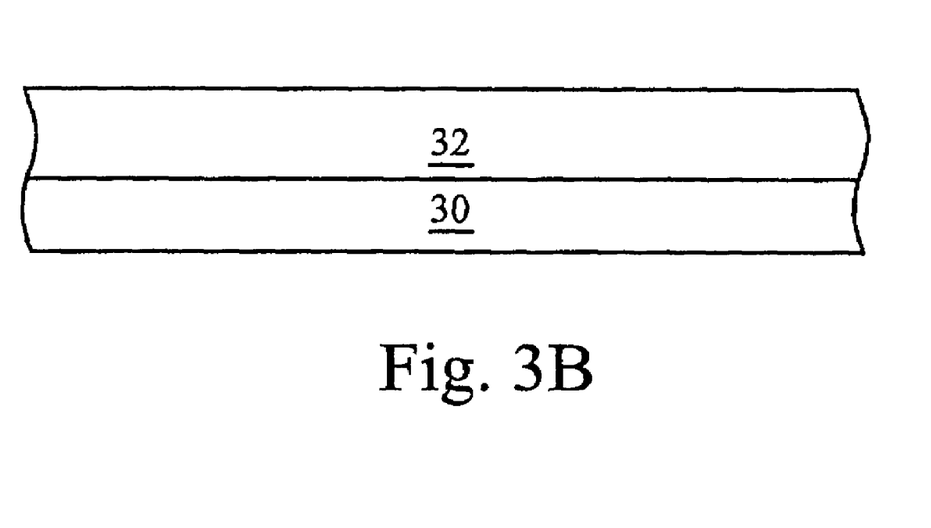

FIG. 3A illustrates a substrate 30 for forming integrated circuits (not shown). Substrate 30 is preferably lightly doped with p-type impurities, and thus the illustrated region comprises a P-well region, although substrate 30 can also be of n-type. The cross-sectional view is taken along the A-A' plane in FIG. 2, as explained in the previous paragraphs. An inter-layer dielectric (ILD) 32 is formed over the substrate 30. Conductive lines 20 are formed over the substrate 30 and are connected to integrated circuit devices (not shown), for example, redundant memory cells or other redundant sub circuits. FIG. 3B shows a cross-sectional view along the B-B' plane.

Figure 4A:
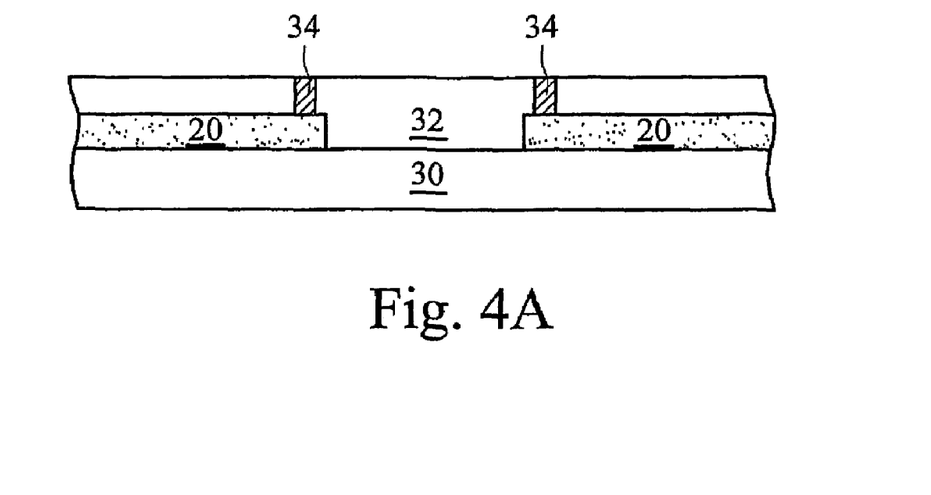
Figure 4B:
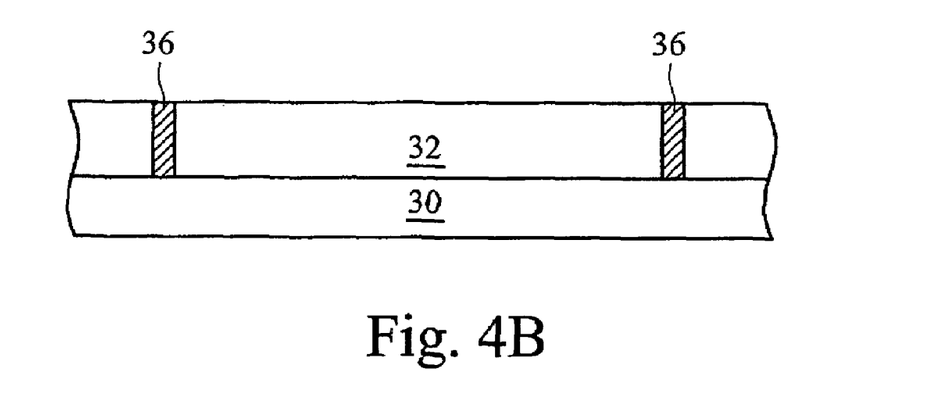
Figure 4C:
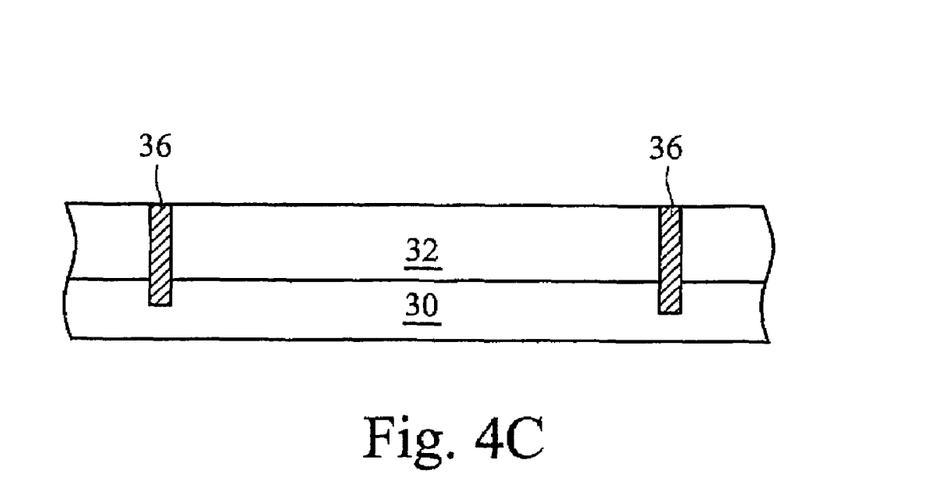

Contacts 34 and 36 are then formed through ILD 32, as shown in FIGS. 4A and 4B, respectively. As is known in the art, contacts 34 and 36 are preferably formed by forming contact openings in ILD 32 and filling the openings with conductive materials, which may comprise tungsten, aluminum, copper, or other well-known alternatives. Contacts 34 and 36 may also have composite structures, including, e.g., barrier and adhesion layers, such as titanium/titanium nitride or tantalum nitride, and other layers as well. FIG. 4A shows that contacts 34 are connected to conductive lines 20. Contacts 36 are preferably connected to the substrate (or well region) 30, as shown in FIG. 4B. Alternatively, contacts 36 extend substantially into the substrate 30, as is shown in FIG. 4C. Extending contacts 36 into substrate 30 increases the contact area, hence a better thermal conductive path is formed, as will be discussed in detail in subsequent paragraphs. Contacts 36 will connect to subsequently formed protection ring 10 (refer to FIG. 2), and multiple contacts 36 are preferably formed. However, contacts 36 are formed in regions $10_2$, but not in regions $10_1$. The reason is that regions $10_1$ comprise conductive lines 20 over the substrate 30. If contacts 36 are formed in region $10_1$, conductive lines 20 will be shorted.

Figure 5A:
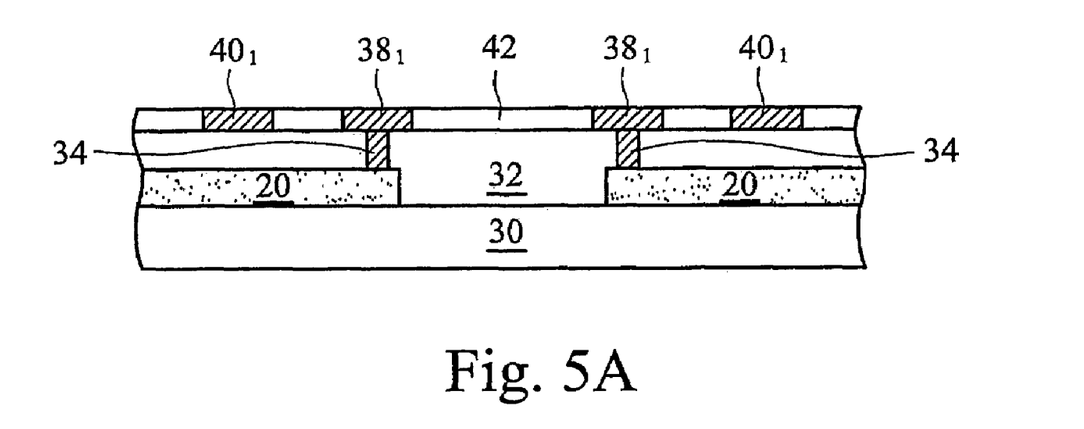
Figure 5B:
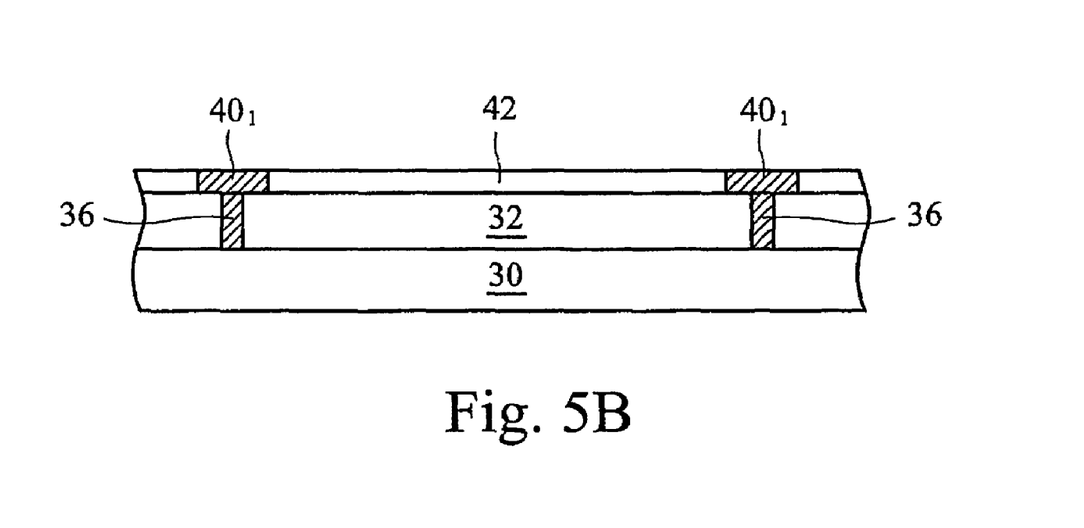

FIGS. 5A and 5B illustrate the formation of metallization layer one, often referred to as $M_1$. Metal features in $M_1$ and overlying metallization layers preferably comprise copper, copper alloys and/or other commonly used conductive materials, and may be formed using single damascene or dual damascene processes. Metal lines $40_1$ and metal islands $38_1$, wherein the subscript 1 indicates $M_1$, are preferably formed using single damascene process. Throughout the description, subscripts are used to indicate respective metallization layers.

Figure 5C:
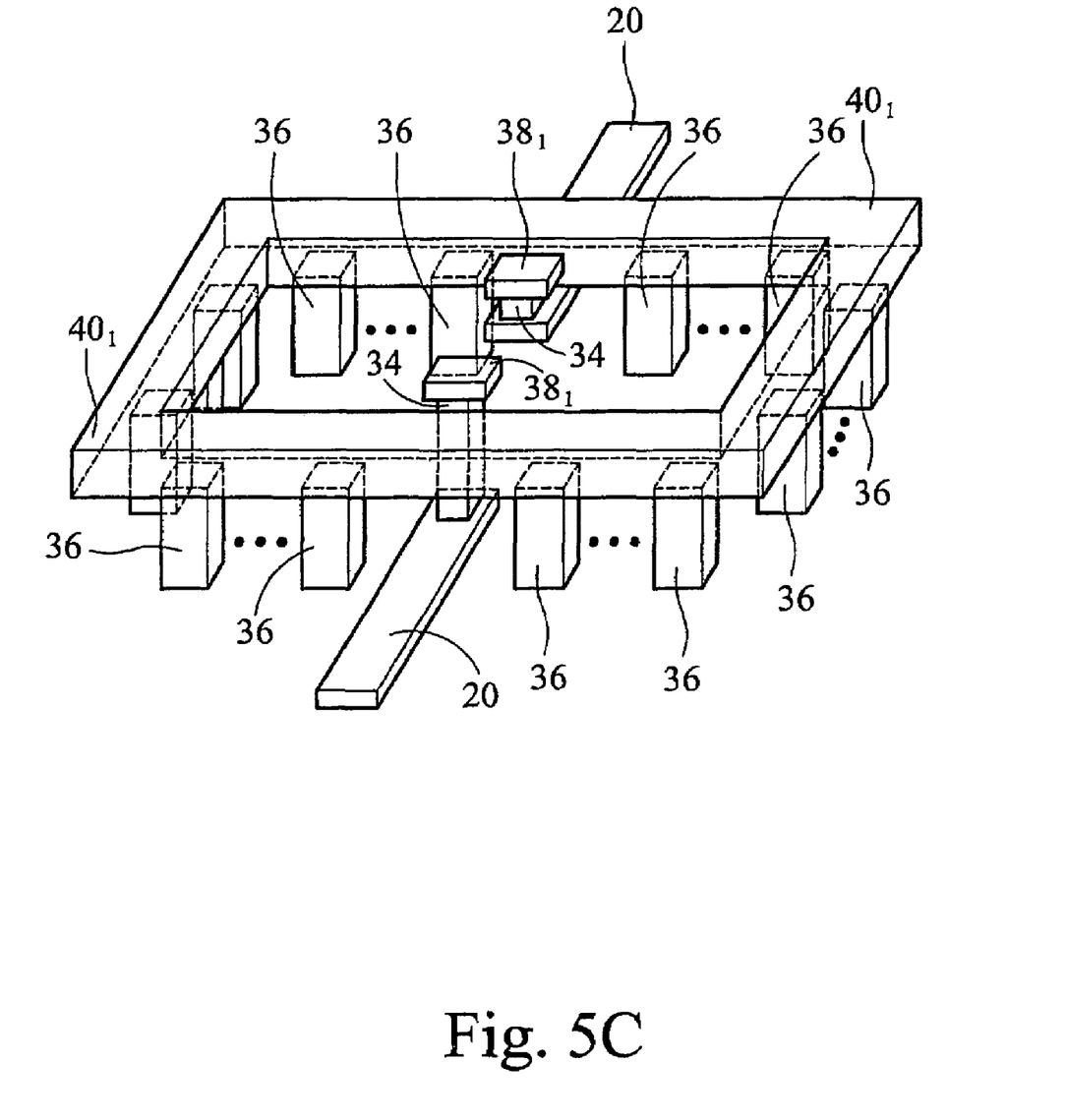

Preferably, to form $M_1$ metal features, an inter-metal dielectric (IMD) 42 is formed over ILD 32. An etch stop layer (ESL, not shown) may optionally be formed between the IMD 42 and ILD 32. Preferably, in the single damascene process for forming metal features, trenches are formed in IMD 42. A diffusion barrier layer (not shown) is preferably formed in trenches. Metal or metal alloys, such as copper or copper alloys, are then filled into the trenches. A chemical mechanical polish (CMP) is then performed to remove excess material, leaving metal lines $40_1$ and metal islands $38_1$. Metal lines $40_1$ are connected to contacts 36. Note that metal lines $40_1$ form a portion of the protection ring 10. Viewed from top, metal lines $40_1$ preferably form a closed loop. FIG. 5C provides a 3D view of the structure formed in previously discussed steps, wherein only one set of metal islands $38_1$ is shown for simplicity purposes.

Figure 6A:
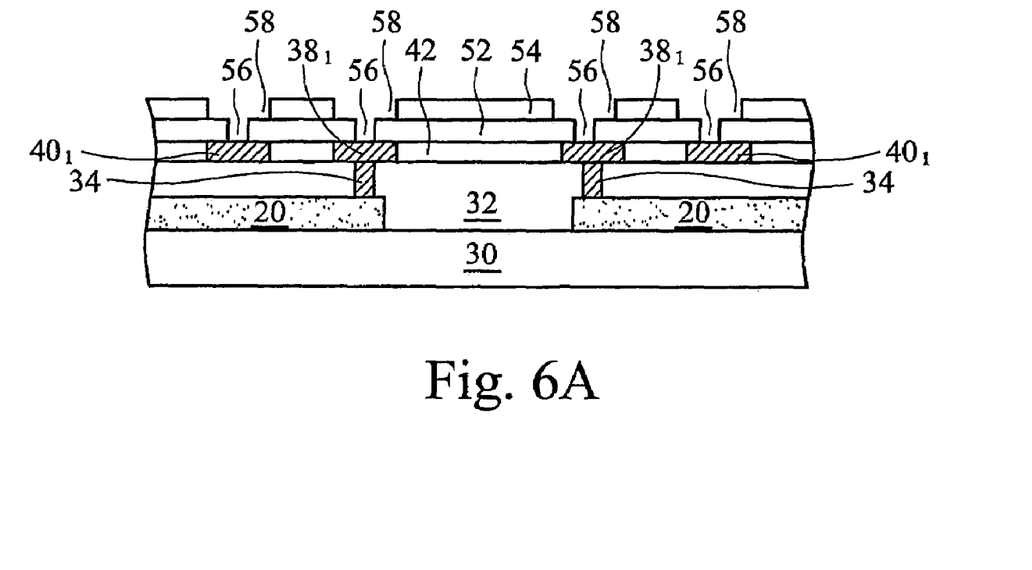
Figure 6B:
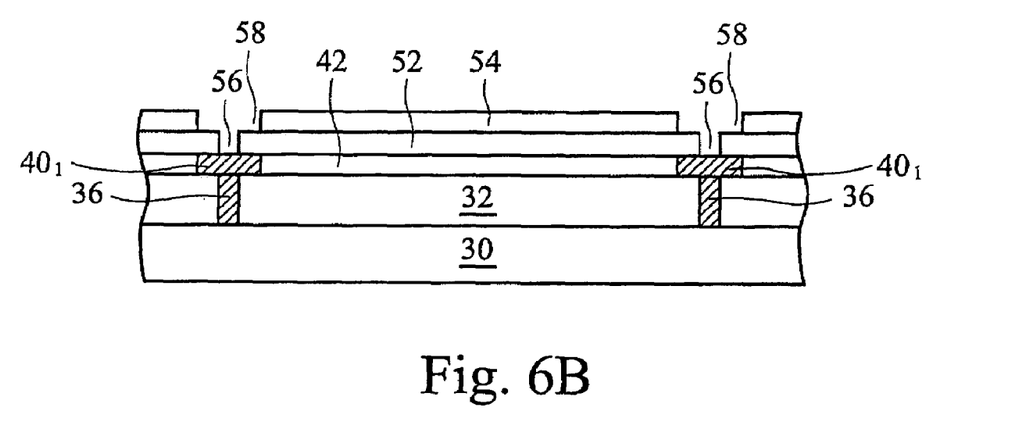

Dual damascene processes are preferably performed to form vias and metallization layer two ($M_2$). FIGS. 6A and 6B show the formation of a via IMD layer 52 over IMD layer 42, followed by the formation of a trench IMD 54 over via IMD layer 52. The materials and methods of forming via IMD 52 and trench IMD 54 are known in the art, thus are not repeated herein. In the preferred embodiment, dielectric layers 42, 52 and 54 are formed of different materials having different etching characteristics, thus an underlying layer may be used as an etch stop layer when an overlying layer is etched. In alternative embodiments, etch stop layers may be formed between IMD layers. In yet other embodiments, a via IMD and an overlying trench IMD may be formed as a single layer.

Via openings 56 and trench openings 58 are then formed, preferably by etching via IMD 52 and trench IMD 54, respectively. In the preferred embodiment, trench IMD 52 is used as an etch stop layer for etching via openings 58. In alternative embodiments wherein the via IMD layer 52 and trench IMD layer 54 are combined as a single layer, the depth of the trench openings 58 is controlled by adjusting the etching time.

Figure 7A:
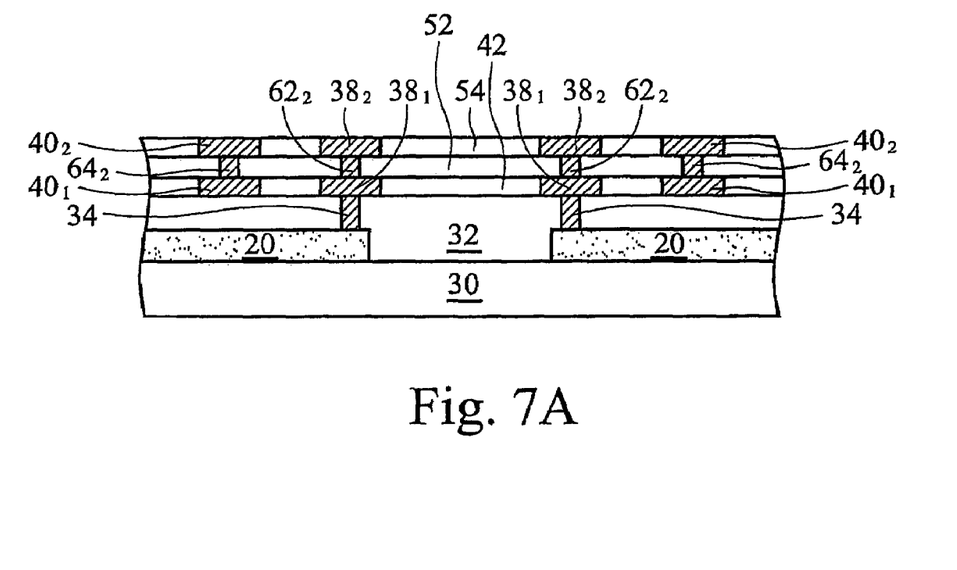
Figure 7B:
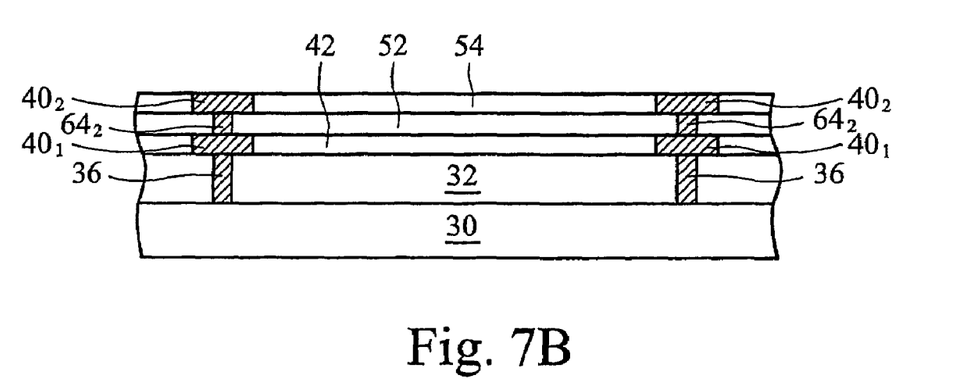

FIGS. 7A and 7B illustrate the formation of metal lines $40_2$, islands $38_2$, and vias $62_2$ and $64_2$. A barrier layer (not shown), preferably comprises titanium, titanium nitride, tantalum, tantalum nitride, and combinations thereof, is preferably formed in openings 56 and 58. The barrier layer prevents copper from diffusing into IMD layers 52 and 54. The remaining space of the via openings 56 and trench openings 58 are filled with conductive materials, preferably copper or copper alloys. A CMP is performed to level the surface, leaving metal lines $40_2$, islands $38_2$, and vias $62_2$ and $64_2$.

Figure 8A:
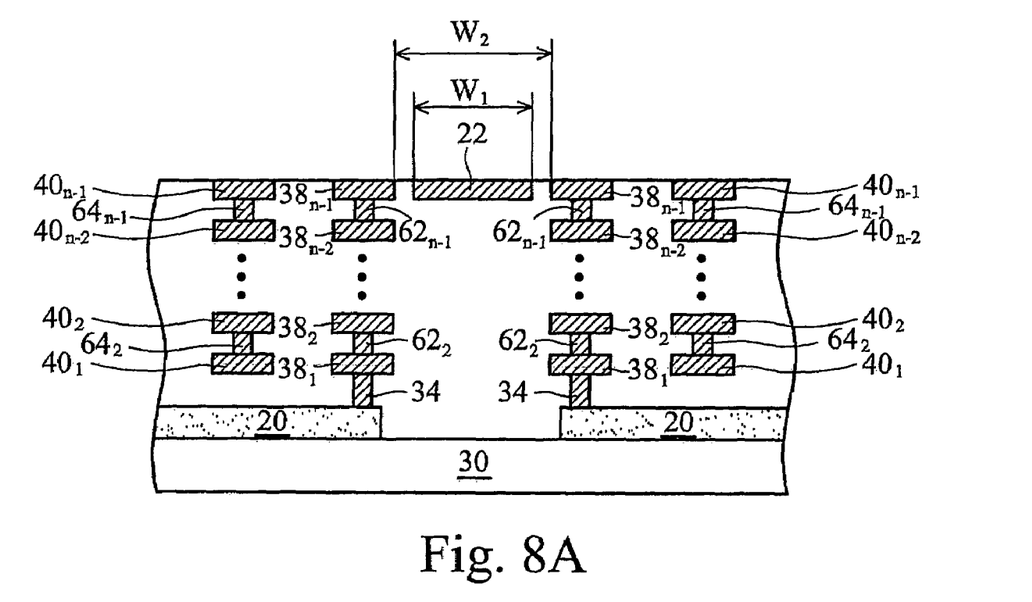
Figure 8B:
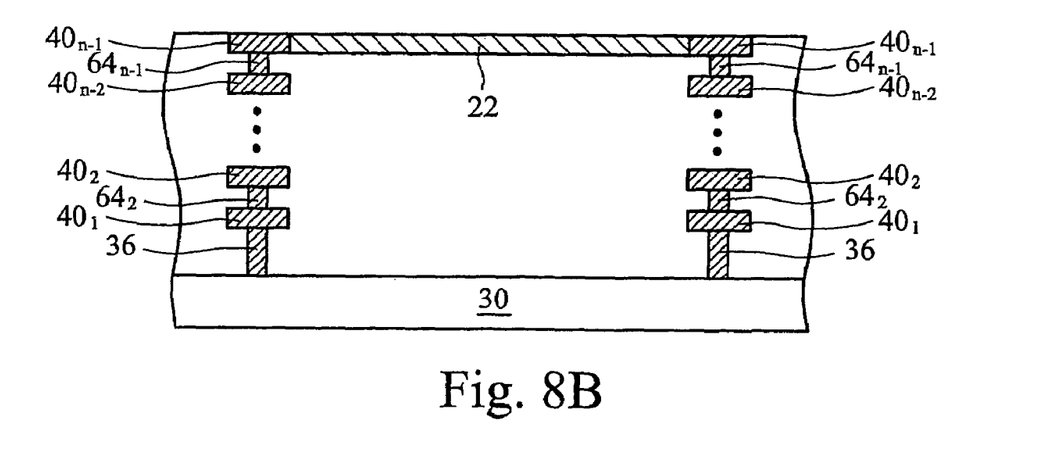

Metal lines $40_2$ through $40_{(n-1)}$, islands $38_2$ through $38_{(n-2)}$ vias $62_2$, through $62_{(n-1)}$ and vias $64_2$ through $64_{(n-1)}$ are then formed layer by layer, each connecting to a respective underlying metal feature. A resulting structure is shown in FIGS. 8A and 8B. In order to have clearer views, ILD layer 32 and overlying IMD layers are not shown.

FIGS. 8A and 8B also illustrate the formation of metallization layer n-1, which is one layer under the top metallization layer. Referring to FIG. 8B, a thermally conductive plate 22 is formed connecting to the metal lines $40_{(n-1)}$. Throughout the description, the thermally conductive plate 22 is alternatively referred to as a metal plate 22 as it is preferably formed of metal, although non-metal materials can be used. The preferred materials include copper, copper alloy, aluminum, aluminum alloy, and the like.

In the preferred embodiment, thermally conductive plate 22 connects to the metal lines $40_{(n-1)}$ at both ends. Although thermally conductive plate 22 is shown as a distinct feature from metal lines $40_{(n-1)}$, in the practical case, they are preferably formed as a continuous feature, as shown in FIG. 8B. In other embodiments, only one end of the thermally conductive plate 22 is connected to a metal line $40_{(n-1)}$. In yet other embodiments, thermally conductive plate 22 and metal lines $40_{(n-1)}$ are coupled through a material having high thermal conductivity, and both the thermally conductive plate 22 and the connecting material may comprise conductive materials, semiconductors, and/or insulators. FIG. 8A illustrates that metal plate 22 is between the metal islands $38_{(n-1)}$. Thermally conductive plate 22 preferably has a width $W_1$, preferably greater than about 50 percent of a distance $W_2$ between metal islands $38_{(n-1)}$.

Figure 9A:
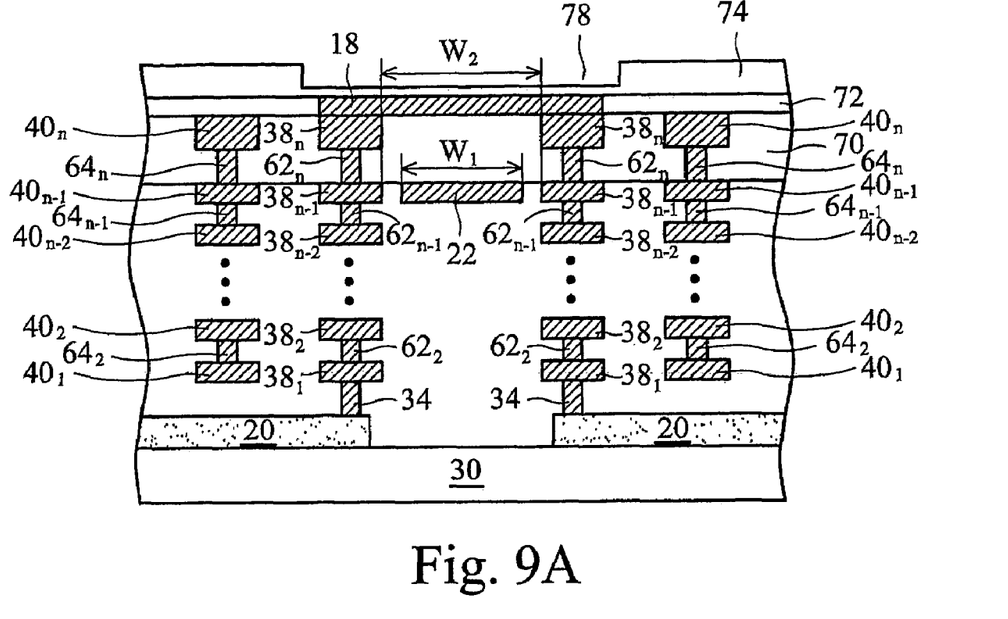
Figure 9B:
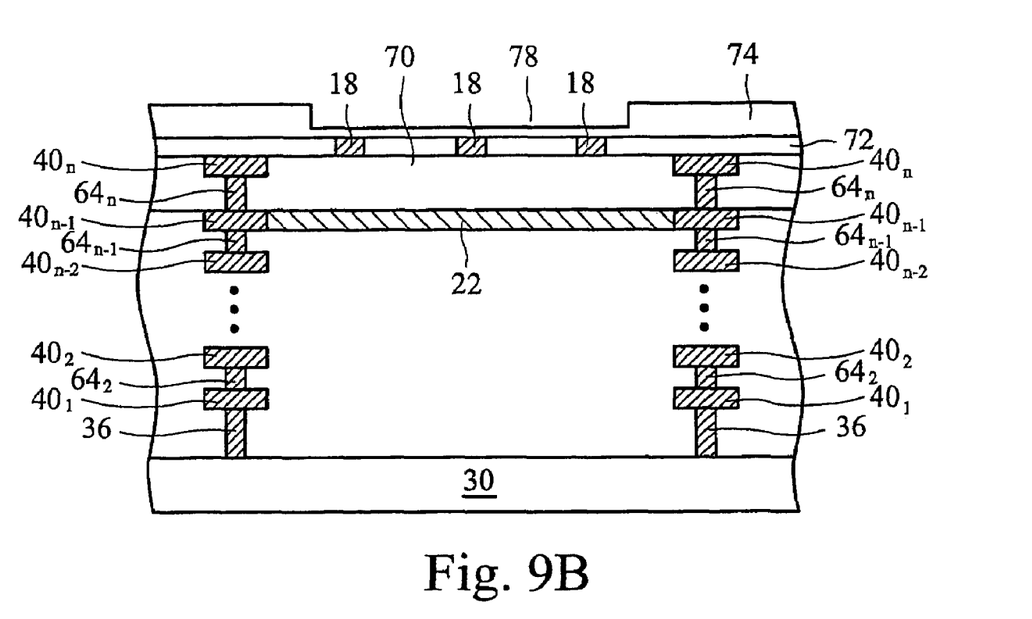

Referring to FIGS. 9A and 9B, a top metallization layer ($M_n$) and underlying vias $62_n$ and $64_n$ are formed. Instead of being formed in low-k inter-metal dielectrics, the top metallization layer $M_n$ is preferably formed in a top dielectric layer 70 that is suitable for preventing moisture penetration and is mechanically stronger than low-k IMDs. Preferred materials include undoped silicate glass, fluorine-doped silicon oxide, and the like.

The formation of protection ring 10 is thus concluded. Metal lines $40_1$ through $40_n$ as well as vias $64_2$ through $64_n$ form the protection ring 10, as is shown in FIG. 2. In regions $10_2$, the protection ring 10 is connected to substrate 30 through contacts 36. While in regions $10_1$, protection ring 10 ends at $M_1$. It is appreciated that regions $10_1$ and $10_2$ are such laid out for the convenience of arranging fuses 18, and other layouts may also be used.

Referring back to FIGS. 9A and 9B, a first passivation layer 72 is then formed over the metallization layer $M_n$. Passivation layer 72 preferably comprises dielectric materials such as oxide or SiN formed using plasma enhanced chemical vapor deposition (PECVD). Fuses 18, which are preferably formed of aluminum or aluminum alloys, are then formed in passivation layer 72 and connecting metal islands $38_n$. However, other conductive materials such as copper or copper alloy can also be used to form fuses 18. After the formation of the first passivation layer 72, a second passivation layer 74 is formed.

When a sub circuit on a chip is found to be defective and needs to be replaced, a region 78, sometimes referred to as a fuse window, is preferably etched until a thin layer of the passivation layer 72 is left. A laser beam burns the remaining passivation layer 74 and a fuse 18. During this process, heat is generated. Since metal plate 22 comprises material having good thermal conductivity, heat dissipated to the metal plate 22 is conducted to the protection ring 10. With the layered structure of metal lines 40 and vias 64, heat is conducted down through contacts 36 into substrate 30. This heat path has high thermal conductivity. Therefore, heat generated during the laser process is effectively rerouted, and heat reaching the underlying low-k dielectric layers is reduced. This prevents the peeling between the layers. In addition, metal plate 22 functions as a micro-cracking stopper. Micro cracks generated during laser burning will stop at the metal plate 22, and cannot extend downward.

By using the preferred embodiments of the present invention, laser repair yield and circuit reliability are improved. The preferred embodiments of the present invention are fully compatible with the existing semiconductor manufacturing processes, and no extra cost is incurred.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure comprising:
    a semiconductor substrate;
    a laser fuse connected to a connection structure over the semiconductor substrate;
    a protection ring over the semiconductor substrate and substantially enclosing the laser fuse and the connection structure;
    a conductive plate underlying and physically disconnected from the laser fuse, the conductive plate being physically connected to the protection ring, wherein the conductive plate comprises a first end physically connected to the protection ring, and a second end physically disconnected from the protection ring; and
    at least one electrical contact thermally coupling the protection ring and the semiconductor substrate.

2. The semiconductor structure of claim 1, wherein the conductive plate comprises a metal and is formed in a metallization layer immediately underlying a top metallization layer.

3. The semiconductor structure of claim 1, wherein the protection ring comprises a first region and a second region, and wherein the first region is connected to the substrate by a plurality of contacts, and wherein the second region is not connected to the substrate by contacts.

4. The semiconductor structure of claim 1, wherein the at least one contact substantially extends into the substrate.

5. The semiconductor structure of claim 1, wherein the at least one contact is coupled to a P-well region of the semiconductor substrate.

6. An integrated circuit structure formed in a semiconductor chip, the integrated circuit structure comprising:
- a protection ring connected to a semiconductor substrate, wherein the protection ring comprises:
  - a plurality of metal lines in respective metal layers and surrounding a fuse region of the semiconductor chip, wherein the plurality of metal lines each forms a ring;
  - a plurality of vias connecting each metal line with a superjacent or subjacent metal line; and
  - a plurality of dielectric layers respectively isolating each metal layer from each subjacent or superjacent metal layer;
- a plurality of contacts physically connecting the protection ring to the semiconductor substrate, wherein the protection ring comprises a first region and a second region, and wherein the first region is connected to the substrate by a plurality of contacts, and wherein the second region is not connected to the substrate by contacts; and
- a metal plate underlying a top metallization layer of the metal layers, wherein the metal plate is electrically connected to the protection ring.

7. The integrated circuit structure of claim 6 further comprising a laser fuse structure in the fuse region, wherein the laser fuse structure comprises:
- a laser fuse;
- a plurality of metal islands in respective metal layers under the laser fuse; and
- a plurality of additional vias connecting the respective metal islands to subjacent or superjacent metal islands; and
- a conductive line electrically coupling the laser fuse and an integrated circuit.

8. The integrated circuit structure of claim 7, wherein a width of the metal plate is greater than about 50 percent of a distance between metal islands in a same metallization layer.

9. The integrated circuit structure of claim 6, wherein the metal lines of the protection ring distribute from a first metallization layer to a top metallization layer.

10. The integrated circuit structure of claim 6, wherein the metal plate and a metal line in a same metallization layer are continuous.

11. A semiconductor structure comprising:
- a semiconductor substrate;
- a fuse structure comprising a laser fuse and a connection structure over the semiconductor substrate, the fuse being on a top metallization layer;
- a protection ring over the semiconductor substrate and substantially enclosing the fuse structure;
- a metal plate in a metal layer immediately underlying the top metallization layer, the metal plate having a lengthwise direction and a width wise direction, wherein the metal plate is physically connected to the protection ring only in the lengthwise direction; and
- a plurality of contacts connecting the protection ring and the semiconductor substrate.

12. The integrated circuit structure of claim 11, wherein both ends of the metal plate are physically connected to the protection ring.

13. The integrated circuit structure of claim 6, wherein at least one end of the metal plate is physically connected to the protection ring.

14. The semiconductor structure of claim 1, wherein the semiconductor substrate and the conductive plate are interconnected through metal features only.

* * * * *